(12) United States Patent
Kanda

(10) Patent No.: US 10,137,518 B2
(45) Date of Patent: Nov. 27, 2018

(54) SEMICONDUCTOR PACKAGE, ELECTRONIC DEVICE, AND SOLDER MOUNTING METHOD

(71) Applicant: FUJITSU LIMITED, Kawasaki-shi, Kanagawa (JP)

(72) Inventor: Takashi Kanda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 65 days.

(21) Appl. No.: 14/976,266

(22) Filed: Dec. 21, 2015

(65) Prior Publication Data

US 2016/0255728 A1 Sep. 1, 2016

(30) Foreign Application Priority Data

Feb. 27, 2015 (JP) .................................. 2015-038232

(51) Int. Cl.
*H05K 1/16* (2006.01)
*B23K 1/00* (2006.01)
(Continued)

(52) U.S. Cl.
CPC .......... *B23K 1/0016* (2013.01); *H01L 23/367* (2013.01); *H01L 23/49811* (2013.01);
(Continued)

(58) Field of Classification Search
CPC ... H01L 23/5226; H01L 23/15; H01L 23/367; H01L 23/3731; H01L 23/49811; H01L 2224/16227; H01L 2224/32225; H01L 2224/3253; H01L 2224/73253; H01L 2024/01; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/095; H05K 2201/09509; H05K 2201/09518; H05K 2201/09527; H05K 2201/09536; H05K 2201/09545; H05K 2201/09554; H05K 2201/09581; H05K 2201/096;
(Continued)

(56) References Cited

U.S. PATENT DOCUMENTS 5,369,551 A 11/1994 Gore et al.
5,490,040 A 2/1996 Gaudenzi et al.
(Continued)

FOREIGN PATENT DOCUMENTS

JP 5-291432 11/1993
JP 7-202378 8/1995
(Continued)

OTHER PUBLICATIONS

Japanese Office Action dated Aug. 14, 2018 for corresponding Japanese Patent Application No. 2015-038232, with English Translation, 7 pages.

*Primary Examiner* — Pete T Lee
(74) *Attorney, Agent, or Firm* — Fujitsu Patent Center

(57) ABSTRACT

A semiconductor package includes: a first substrate, disposed so as to be opposed to a second substrate, on which a semiconductor chip is mounted; and a solder ball formed on the first substrate, wherein the solder ball is joined to a pin that penetrates through the second substrate.

17 Claims, 18 Drawing Sheets

(51) Int. Cl.
*H01L 23/498* (2006.01)
*H05K 1/11* (2006.01)
*H05K 3/34* (2006.01)
*H01L 23/367* (2006.01)
*H01L 23/15* (2006.01)
*H01L 23/373* (2006.01)
*H05K 1/02* (2006.01)
*H05K 1/18* (2006.01)

(52) U.S. Cl.
CPC ........ *H01L 23/49827* (2013.01); *H05K 1/113* (2013.01); *H05K 3/3436* (2013.01); *H01L 23/15* (2013.01); *H01L 23/3731* (2013.01); *H01L 2224/16227* (2013.01); *H01L 2224/32225* (2013.01); *H01L 2224/32245* (2013.01); *H01L 2224/73253* (2013.01); *H01L 2924/15311* (2013.01); *H01L 2924/16251* (2013.01); *H05K 1/0271* (2013.01); *H05K 1/115* (2013.01); *H05K 1/181* (2013.01); *H05K 2201/094* (2013.01); *H05K 2201/09036* (2013.01); *H05K 2201/09136* (2013.01); *H05K 2201/09572* (2013.01); *H05K 2201/10295* (2013.01); *H05K 2201/10303* (2013.01); *H05K 2201/10734* (2013.01); *Y02P 70/613* (2015.11)

(58) Field of Classification Search
CPC .......... H05K 2201/09609; H05K 2201/09618; H05K 2201/09627; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 3/4602; H05K 1/0271; H05K 1/113; H05K 1/181; H05K 3/3436; Y02P 70/613; B23K 1/0016
See application file for complete search history.

(56) References Cited

U.S. PATENT DOCUMENTS

| | | | | |
|---|---|---|---|---|
| 6,259,039 | B1* | 7/2001 | Chroneos, Jr. | H01R 43/0256 174/260 |
| 6,294,407 | B1* | 9/2001 | Jacobs | H01L 21/4839 438/108 |
| 6,471,526 | B1* | 10/2002 | Harper, Jr. | H05K 7/1061 439/66 |
| 7,495,330 | B2* | 2/2009 | Ichikawa | H01L 23/49827 257/698 |
| 8,378,231 | B2* | 2/2013 | Tsukada | H05K 1/0204 174/267 |
| 2003/0000739 | A1* | 1/2003 | Frutschy | H01L 23/49811 174/260 |
| 2010/0018764 | A1* | 1/2010 | Rangsten | B64G 1/26 174/264 |
| 2012/0261832 | A1* | 10/2012 | Takano | H01L 23/49822 257/774 |
| 2015/0228569 | A1* | 8/2015 | Wang | H01L 21/4853 361/771 |

FOREIGN PATENT DOCUMENTS

| | | |
|---|---|---|
| JP | 11-167944 A | 6/1999 |
| JP | 2001-44326 | 2/2001 |
| JP | 2008-135650 | 6/2008 |

* cited by examiner

SEMICONDUCTOR PACKAGE, ELECTRONIC DEVICE, AND SOLDER MOUNTING METHOD

CROSS-REFERENCE TO RELATED APPLICATION

This application is based upon and claims the benefit of priority of the prior Japanese Patent Application No. 2015-038232, filed on Feb. 27, 2015, the entire contents of which are incorporated herein by reference.

FIELD

The embodiments discussed herein are related to a semiconductor package, an electronic device, and a solder mounting method.

BACKGROUND

A ball grid array (BGA) package is a structure of a semiconductor package including a semiconductor chip such as a large scale integration (LSI).

Related arts are disclosed in Japanese Laid-open Patent Publication No. 5-291432, No. 7-202378, No. 2001-44326, or No. 2008-135650.

SUMMARY

According to an aspect of the embodiments, a semiconductor package includes: a first substrate, disposed so as to be opposed to a second substrate, on which a semiconductor chip is mounted; and a solder ball formed on the first substrate, wherein the solder ball is joined to a pin that penetrates through the second substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
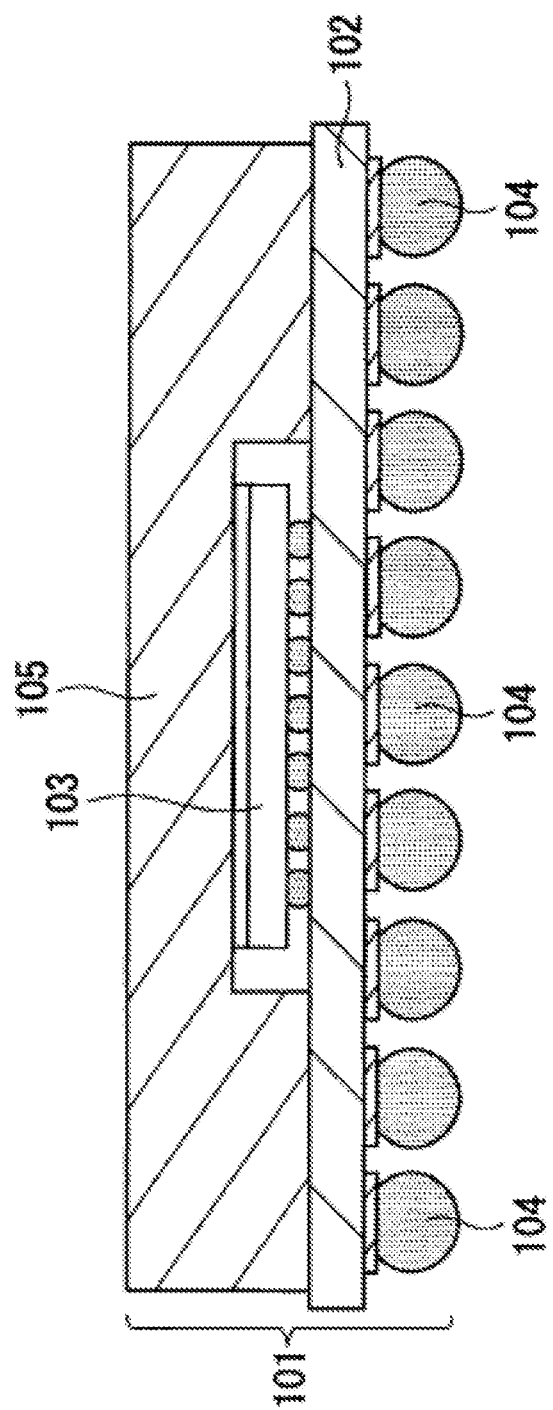
FIG. 1 illustrates an example of a sectional view of a BGA package.

A BGA package has hemispherical external input/output terminals (solder balls) arranged in an array on the bottom surface of a package substrate. FIG. 1 illustrates an example of a sectional view of a BGA package. As illustrated in FIG. 1, the BGA package 101 includes a package substrate 102, an LSI chip 103 mounted on the package substrate 102, and solder balls 104 electrically coupled with the LSI chip 103. A heat spreader 105 that dissipates heat of the LSI chip 103 is mounted on the package substrate 102.

Owing to the increase in the package size of the semiconductor package, the warpage of the package substrate increases. Therefore, the mounting of the semiconductor package on a mother board becomes difficult, and the mounting yield of the semiconductor package may decrease. During the reflow processing in mounting the semiconductor package on the mother board, the semiconductor package and the mother board warp. When the heating of reflow processing is completed, the solder balls joining the package substrate and the mother board harden, and the warpage of the semiconductor package and the mother board returns. At this time, because the thermal expansion coefficient of the substrate of the semiconductor package differs from the thermal expansion coefficient of the printed board of the mother board, the semiconductor package and the mother board differ in the amount of return of warpage (shrink). Therefore, the stress generated in the solder balls increases. For example, the thermal expansion coefficient of the package substrate is 8 to 12 ppm/° C., and the thermal expansion coefficient of the mother board is 15 to 18 ppm/° C. As a result, cracks may occur in the solder balls joining the package substrate and the mother board, and the mounting yield of the semiconductor package may decrease.

Figure 2:
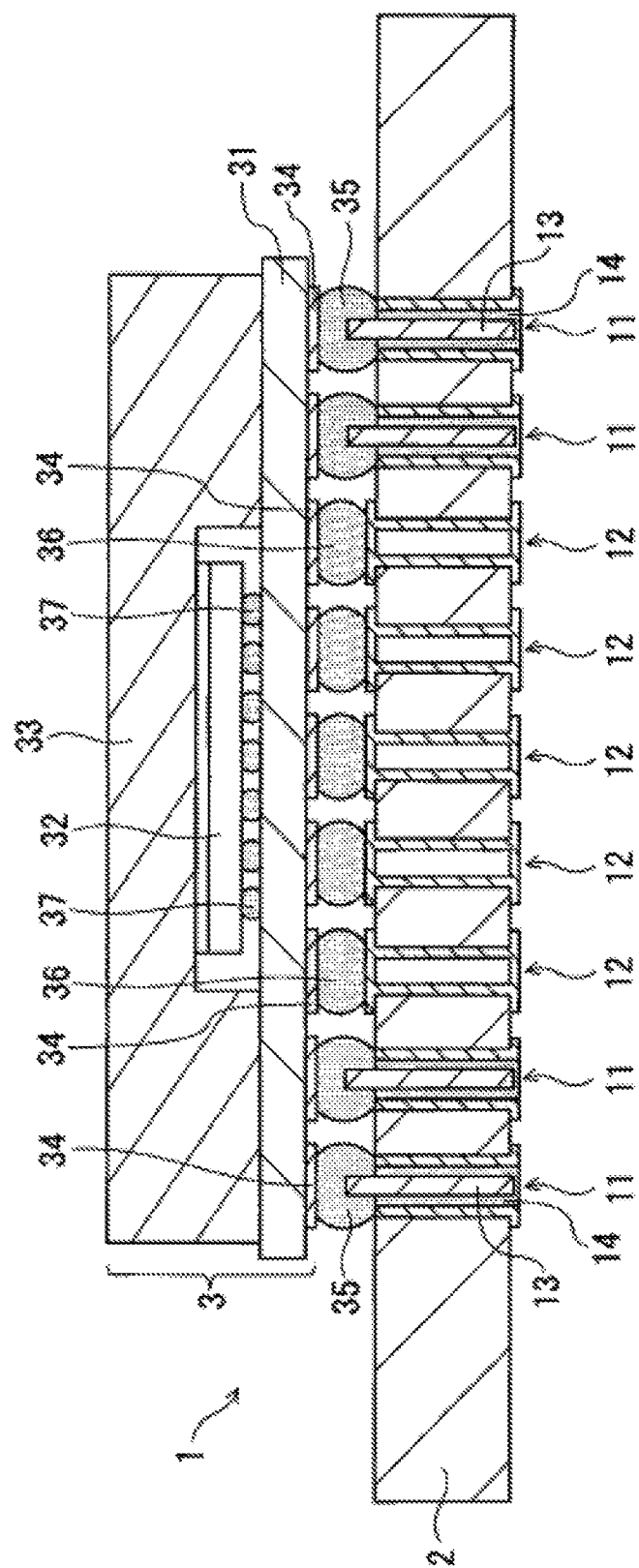
FIG. 2 illustrates an example of a sectional view of an electronic device.

FIG. 2 illustrates an example of a sectional view of an electronic device. The electronic device 1 includes a mother board 2 and a semiconductor package 3. The semiconductor package 3 is mounted on the mother board 2. The mother board 2 is, for example, a printed board. The semiconductor package 3 is, for example, a BGA package.

Figure 3:
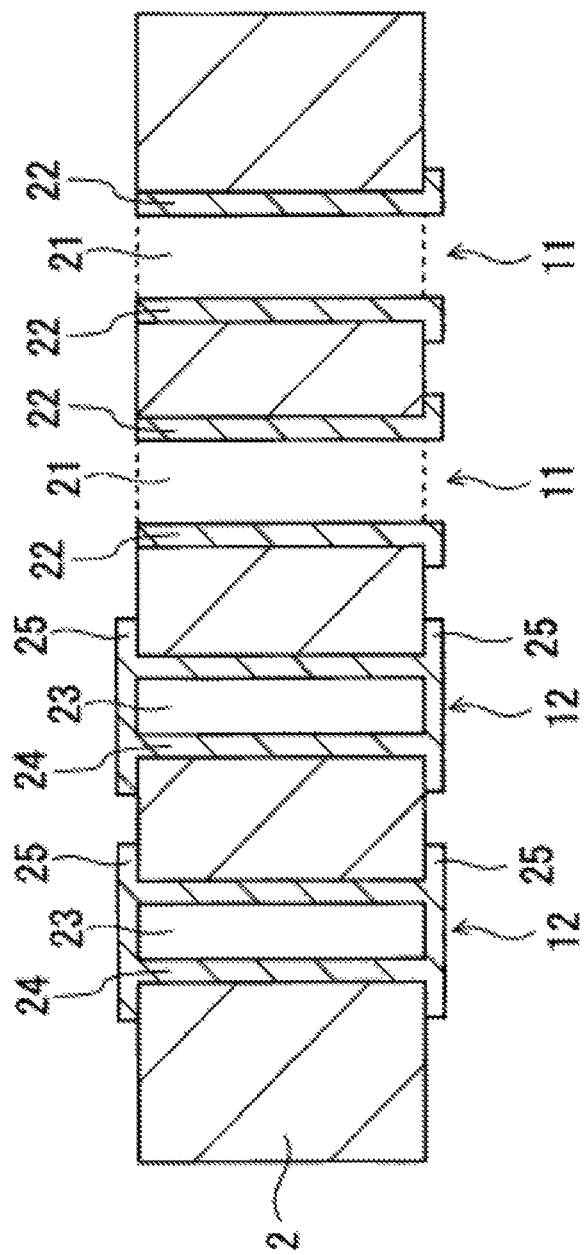
FIG. 3 illustrates an example of a partial sectional view of a mother board.

The mother board 2 has a plurality of plated through-holes (PTH) 11 and 12 penetrating through the mother board 2. FIG. 3 illustrates an example of a partial sectional view of the mother board. The plated through-holes 11 each include a hole 21 penetrating through the mother board 2 and a metal film (conductive film) 22 formed on the side wall of the hole 21. The plated through-holes 11 may be an example of a through-hole. The plated through-holes 12 each include a hole 23 penetrating through the mother board 2 and a metal film (conductive film) 24 formed on the side wall of the hole 23. The metal film 24 is coupled to a land pattern 25. The holes 21 and 23 are formed, for example, using a drill. The material for the metal films 22 and 24 and the land patterns 25 may be, for example, Cu (copper).

The semiconductor package 3 includes a package substrate 31, a semiconductor chip 32, and a heat spreader 33. For example, a build-up substrate, a ceramic substrate, a glass ceramic substrate, or a coreless substrate may be used as the package substrate 31. For example, the package substrate 31 may be an example of a first substrate. The mother board 2 and the package substrate 31 are disposed so as to be opposed to each other. For example, the mother board 2 may be an example of a second substrate. The semiconductor chip 32 and the heat spreader 33 are mounted on a first surface of the package substrate 31. A plurality of electrode pads 34, a plurality of solder balls 35, and a plurality of solder balls 36 are formed on a second surface of the package substrate 31. The second surface of the package substrate 31 is a surface opposed to the mother board 2, and is a surface on the opposite side of the first surface of the package substrate 31. Therefore, the mother board 2 is disposed so as to be opposed to the second surface of the package substrate 31. The solder balls 35 and 36 join the mother board 2 and the package substrate 31 to each other. The material for the solder balls 35 and 36 may be, for example, Sn (tin) or an alloy containing Sn.

The semiconductor chip 32 may be a logic chip such as an LSI (large scale integration). The semiconductor chip 32 is flip-chip bonded to the package substrate 31. With a surface of the semiconductor chip 32 on which a circuit is formed (hereinafter referred to as a circuit surface) facing the package substrate 31 (face-down), an electrode formed on the circuit surface of the semiconductor chip 32 and an electrode formed on the package substrate 31 are joined by solder balls 37. The material for the solder balls 37 is, for example, Sn or an alloy containing Sn.

The heat spreader 33 covers the semiconductor chip 32. The heat spreader 33 is in contact with a surface of the semiconductor chip 32 that is on the opposite side of the circuit surface. The heat spreader 33 may be formed of, for example, a metal material such as Cu (copper) or Al (aluminum) or a highly thermally conductive ceramic material such as SiC (silicon carbide) or AlN (aluminum nitride). The heat spreader 33 dissipates heat transferred from the semiconductor chip 32. A TIM (thermal interface material) may be formed between the semiconductor chip 32 and the heat spreader 33. Examples of the TIM may include thermally conductive materials such as metal paste, silicone rubber, graphite sheet, thermally conductive grease, and adhesive.

Pins 13 are inserted in the plated through-holes 11. The pins 13 may have a cylindrical shape. The material for the pins 13 may be, for example, Cu or Au (gold). The pins 13 are protruding from a first surface of the mother board 2. The first surface of the mother board 2 is a surface opposed to the package substrate 31. First ends (upper ends) of the pins 13 protrude from the plated through-holes 11 leading to the first surface of the mother board 2, and are joined to the solder balls 35. Therefore, the pins 13 are soldered to the electrode pads 34 by the solder balls 35. Second ends (lower ends) and middle parts of the pins 13 are inserted in the plated through-holes 11. The inserted parts of the pins 13 are soldered to the plated through-holes 11 by solder 14 embedded in the plated through-holes 11.

As illustrated in FIG. 3, land patterns 25 are formed on the tops of the plated through-holes 12. The land patterns 25 are joined to the solder balls 36. Therefore, the land patterns 25 are soldered to the electrode pads 34 by the solder balls 36.

By performing reflow processing after placing the semiconductor package 3 on the mother board 2, the semiconductor package 3 is mounted on the mother board 2. By performing reflow processing, warpage is caused in the mother board 2 and the package substrate 31. As illustrated in FIG. 2, solder balls 35 and 36 are used as joints between the mother board 2 and the package substrate 31. The pins 13 inserted in the plated through-holes 11 protrude from the plated through-holes 11 toward the package substrate 31, and the pins 13 and the solder balls 35 are joined. After the heating of reflow processing is completed, the pins 13 inserted in the plated through-holes 11 absorb the stress generated when the warpage of the mother board 2 and the warpage of the package substrate 31 return (shrink), and the stress generated in the solder balls 35 may be reduced. As a result, the occurrence of cracks in the solder balls 35 may be reduced. Therefore, even when warpage occurs in the mother board 2 and the package substrate 31, the semiconductor package 3 can be mounted on the mother board 2, and the mounting yield of the semiconductor package 3 may be improved. The pins 13 may be inserted in the plated through-holes 11 in a part where the warpage of the mother board 2 and/or the warpage of the package substrate 31 during reflow processing are/is significant. For example, when the semiconductor chip 32 is placed in the center of the package substrate 31 as in FIG. 2, the part where the warpage is significant may be the periphery of the package substrate 31 distant from the semiconductor chip 32.

Since the pins 13 and the solder balls 35 are joined, even when the thermal expansion coefficient of the mother board 2 differs from the thermal expansion coefficient of the package substrate 31, the stress generated in the solder balls 35 may be reduced. Therefore, even when the thermal expansion coefficient of the mother board 2 differs from the thermal expansion coefficient of the package substrate 31, the reliability of the joints between the mother board 2 and the package substrate 31 is improved, and the mounting yield of the semiconductor package 3 may be improved. Even in the case of a combination in which the difference in thermal expansion coefficient is great, for example, in the case where a ceramic package is mounted on an organic mother board, the stress generated in the solder balls 35 may be reduced.

Figure 4:
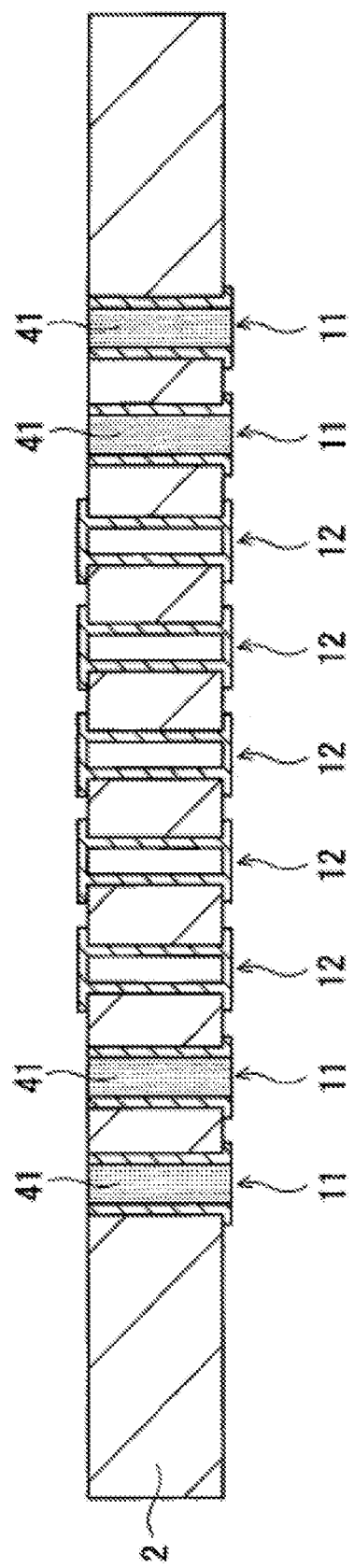
FIG. 4 illustrates an example of a manufacturing process of an electronic device.
Figure 5:
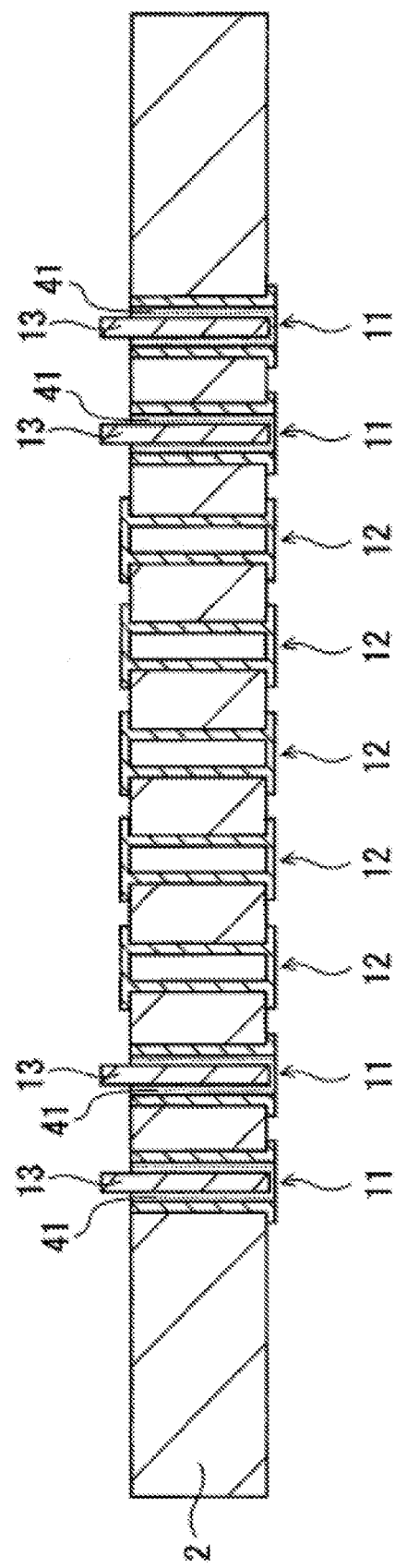
FIG. 5 illustrates an example of a manufacturing process of an electronic device.

FIG. 4 to FIG. 7 illustrate an example of a manufacturing process of an electronic device. The electronic device to be manufactured may be the electronic device illustrated in FIG. 2 or FIG. 3. A mother board 2 is prepared. A plurality of plated through-holes 11 and 12 penetrating through the mother board 2 are formed in the mother board 2. Next, as illustrated in FIG. 4, solder paste 41 is filled into respective ones of the plurality of plated through-holes 11. For example, the filling of the solder paste 41 may be performed using a dispenser or a squeegee. The solder paste 41 contains solder powder and flux. The solder powder is, for example, Sn or an alloy containing Sn. As illustrated in FIG. 5, pins 13 are inserted into respective ones of the plurality of plated through-holes 11, and first ends of the pins 13 are protruded from the plated through-holes 11 leading to the first surface of the mother board 2.

Figure 6:
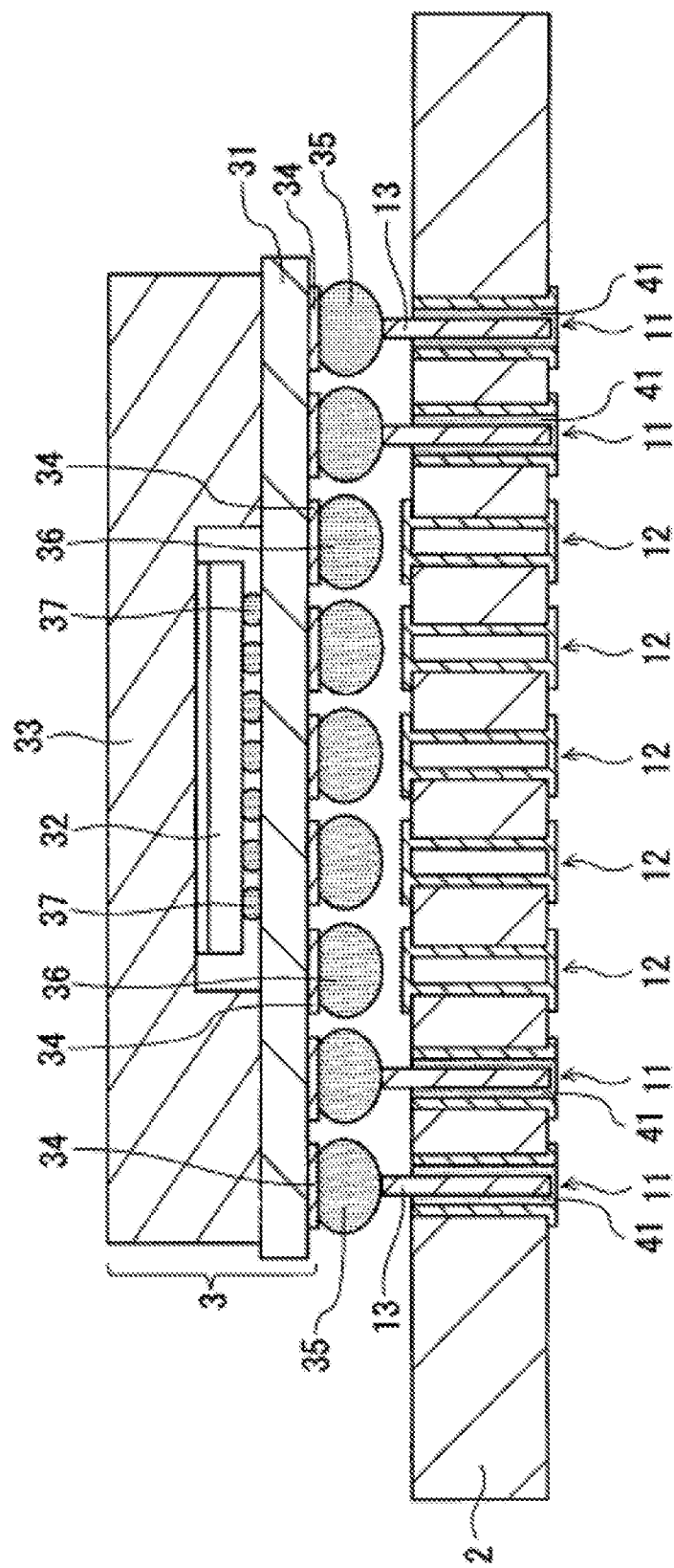
FIG. 6 illustrates an example of a manufacturing process of an electronic device.

As illustrated in FIG. 6, a semiconductor package 3 is mounted on the mother board 2. The semiconductor package 3 is mounted on the first surface of the mother board 2. The mother board 2 and the package substrate 31 are disposed so as to be opposed to each other. A plurality of electrode pads 34, a plurality of solder balls 35, and a plurality of solder balls 36 are formed on the second surface of the package substrate 31. Flux is applied to the plurality of solder balls 35 and 36.

Figure 7:
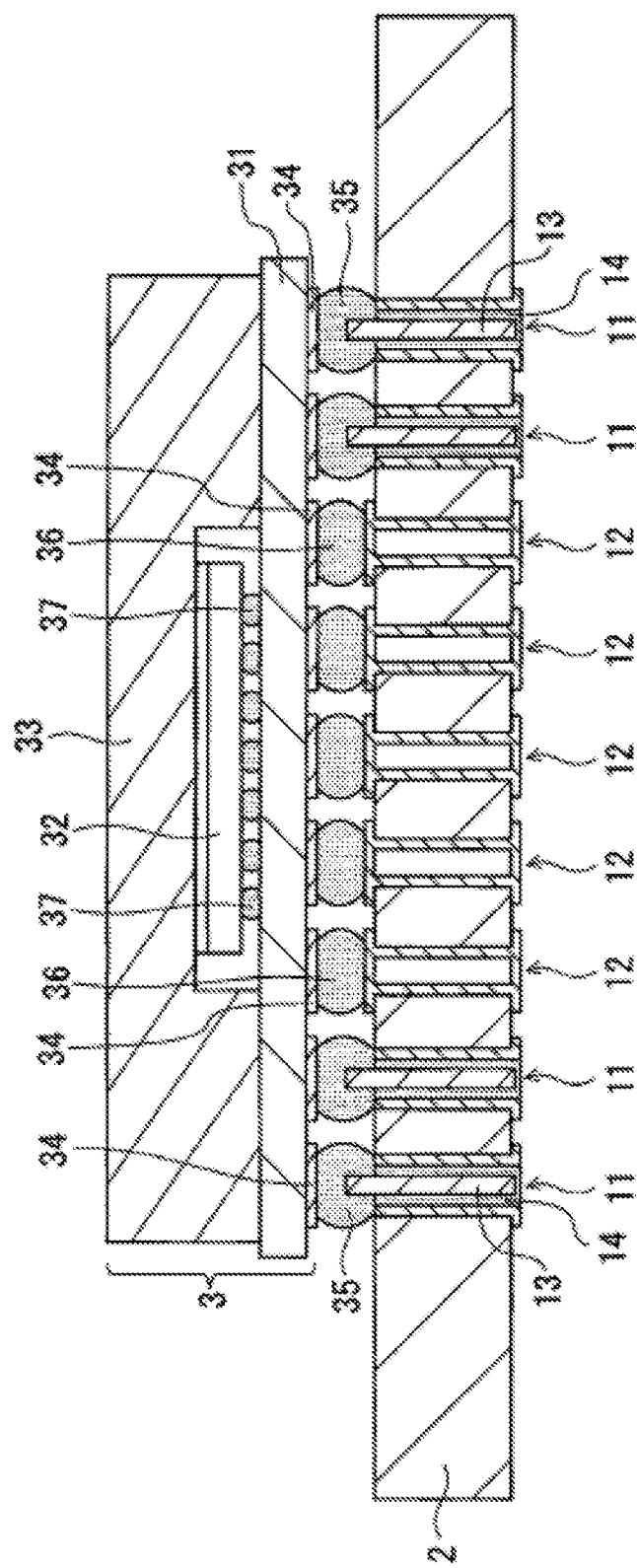
FIG. 7 illustrates an example of a manufacturing process of an electronic device.

As illustrated in FIG. 7, by performing reflow processing, the pins 13 and the solder balls 35 are joined, and the land patterns 25 and the solder balls 36 are joined. For example, the mother board 2 and the semiconductor package 3 are introduced into a reflow furnace and are heated. By performing reflow processing, the solder powder of the solder paste 41 melts, the flux of the solder paste 41 vaporizes, and solder 14 is formed in the plated through-holes 11. Thereby, the inserted parts of the pins 13 are soldered to the plated through-holes 11 by the solder 14 formed in the plated through-holes 11.

By reflow processing, the pins 13 and the solder 14 are joined, and the pins 13 and the solder balls 35 are joined. Until the joining of the pins 13 and the solder 14 is completed, the solder 14 is in a melted state. Until the joining of the pins 13 and the solder balls 35 is completed, the solder balls 35 are in a melted state. Therefore, while reflow processing is performed, the pins 13 can move in the plated through-holes 11 in the vertical direction (the thickness direction of the mother board 2). Owing to the surface tension of the solder balls 35, the pins 13 do not fall off.

Figure 8:
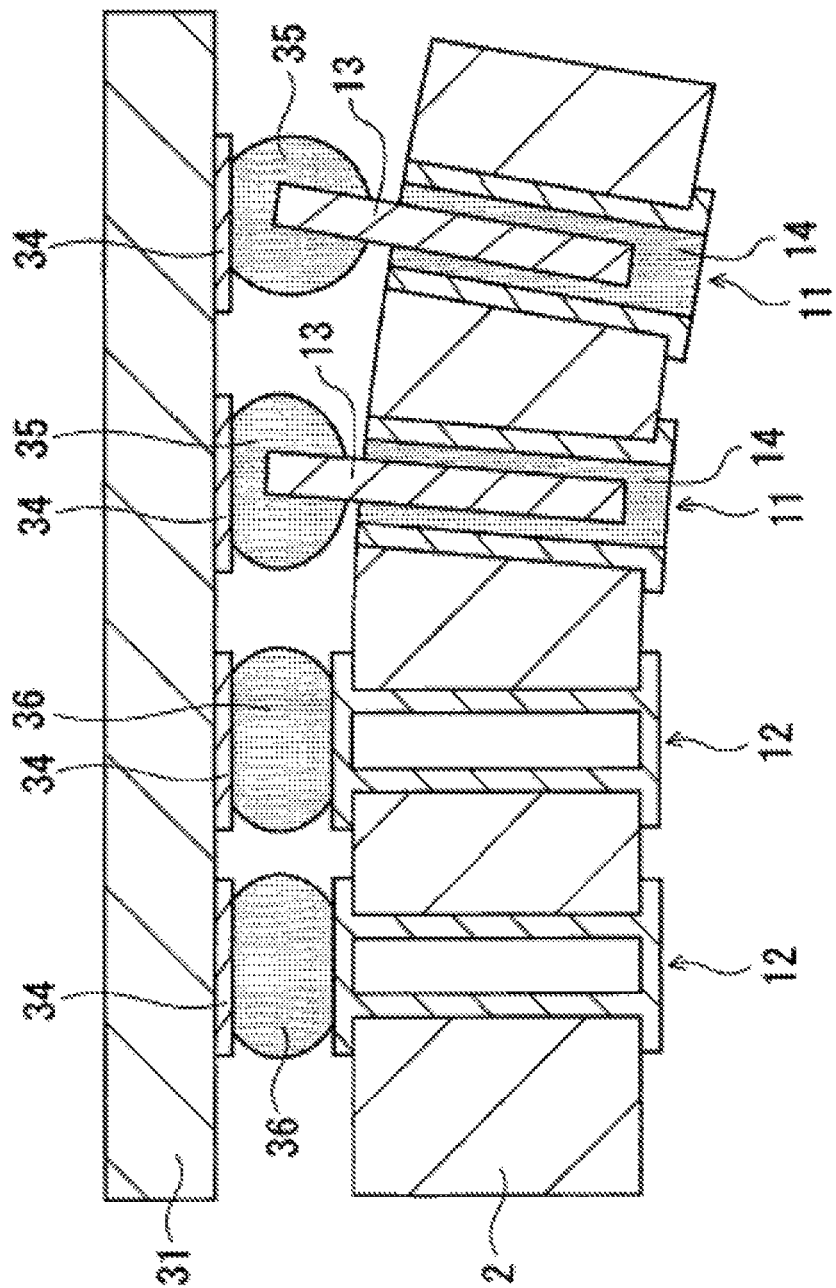
FIG. 8 illustrates an example of a partial sectional view of a mother board.

FIG. 8 illustrates an example of a partial sectional view of a mother board. FIG. 8 illustrates a partial sectional view of the mother board 2 in the case where warpage occurs in the mother board 2. During reflow processing, the mother board 2 warps. When the heating of reflow processing is completed, cooling down causes the solder balls 35 and the solder 14 to harden, the pins 13 to be fixed, and the warpage of the mother board 2 to return. The pins 13 inserted in the plated through-holes 11 absorb the stress generated when the heating of reflow processing is completed and the warpage of the mother board 2 returns (shrinks), and the stress generated in the solder balls 35 may be reduced. Therefore, the reliability of the joints between the mother board 2 and the package substrate 31 is improved, and the mounting yield of the semiconductor package 3 may be improved.

Figure 9:
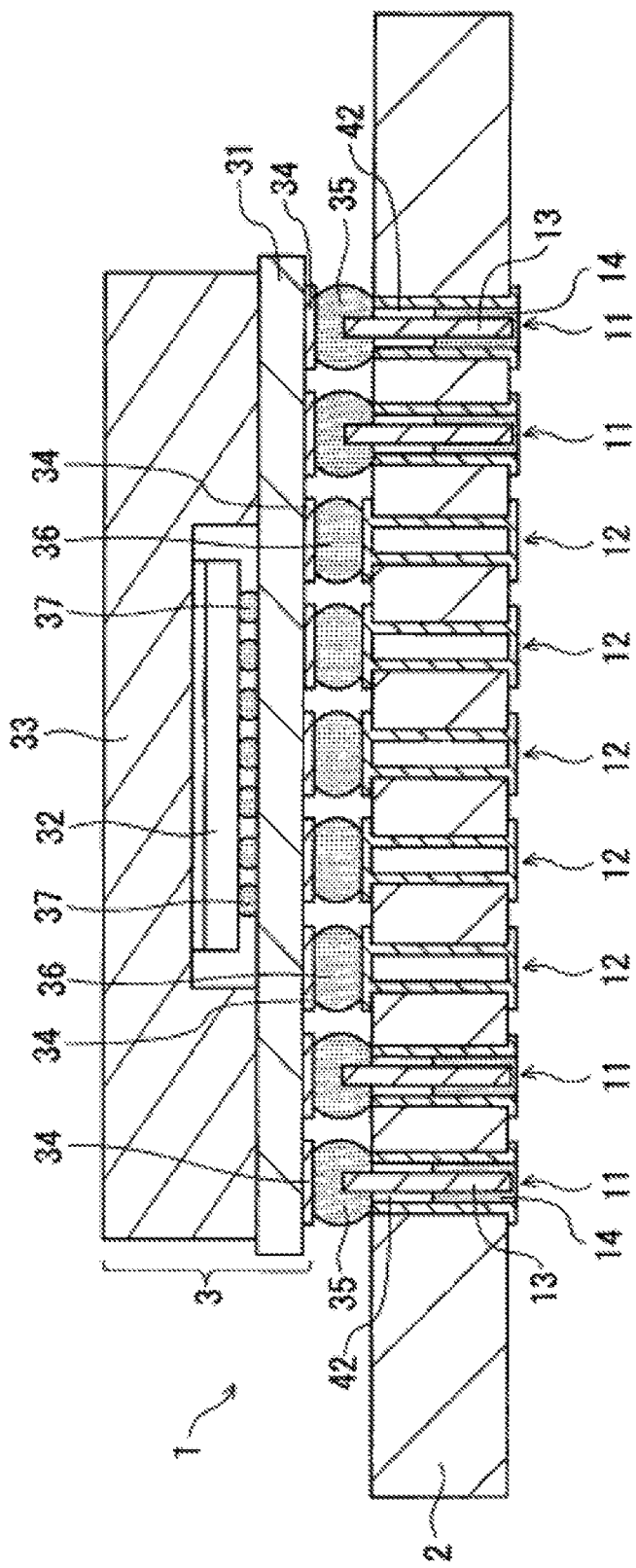
FIG. 9 illustrates an example of a sectional view of an electronic device.

FIG. 9 illustrates an example of a sectional view of an electronic device. As illustrated in FIG. 9, a space 42 may be formed in each of the plated through-holes 11. The amount of solder paste 41 filled into each of the plated through-holes 11 is adjusted, and an area not filled with the solder paste 41 is formed in each of the plated through-holes 11. After that, by performing reflow processing, a space 42 is formed in each of the plated through-holes 11. In FIG. 9, spaces 42 are formed between the solder 14 and the solder balls 35, and the solder 14 and the solder balls 35 are not joined. By separating the solder 14 and the solder balls 35, the stress generated in the solder balls 35 may be reduced.

Figure 10:
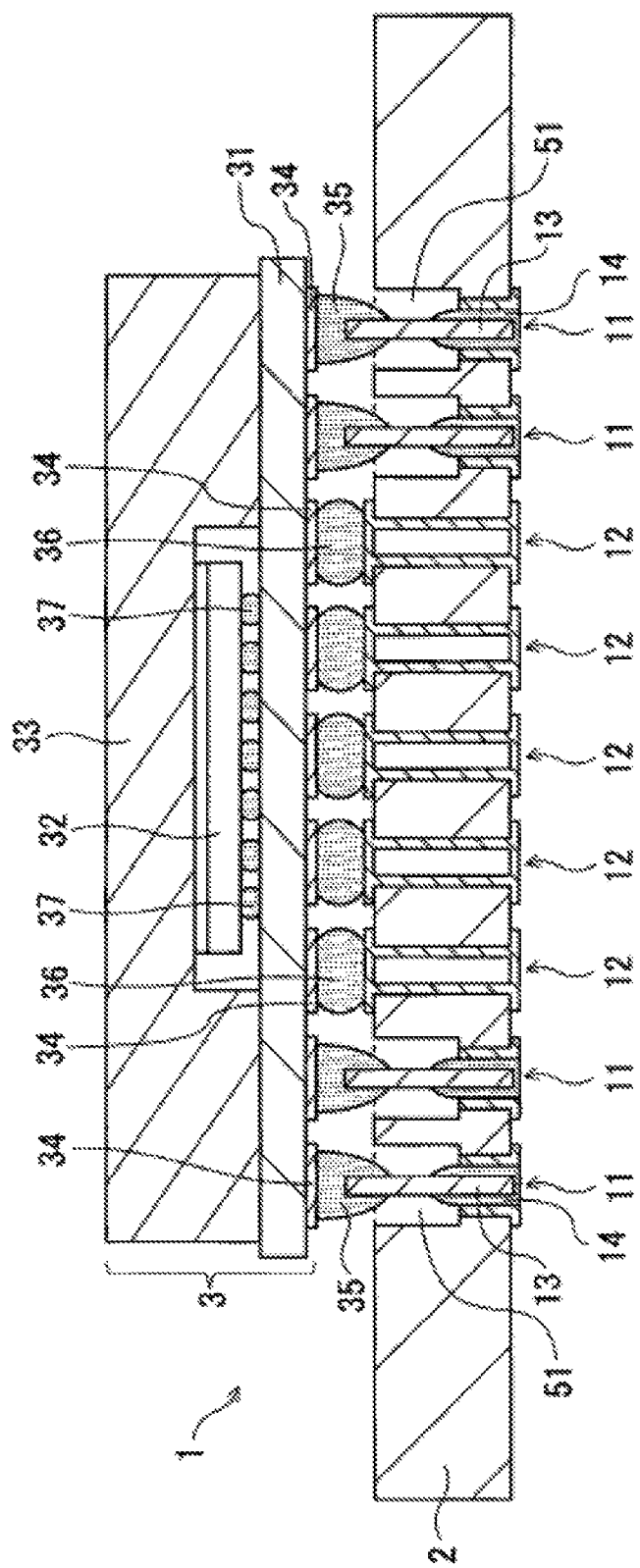
FIG. 10 illustrates an example of a sectional view of an electronic device.

FIG. 10 illustrates an example of a sectional view of an electronic device. In FIG. 10, the same reference signs are used to designate substantially the same or similar components as those illustrated in FIG. 2, and the description thereof may be omitted or reduced. Recesses (counterbores) 51 that communicate with the plated through-holes 11 and have a diameter greater than the diameter of the plated through-holes 11 are formed in the first surface of the mother board 2. The recesses 51 may be circular or rectangular in plan view. Solder 14 and metal film 22 are not formed on the side walls of the recesses 51.

The pins 13 are protruding from the first surface of the mother board 2. First ends and middle parts of the pins 13 protrude upward from the bottom surfaces of the recesses 51, and the first ends of the pins 13 protrude upward from the openings of the recesses 51. Second ends of the pins 13 are inserted in the plated through-holes 11. The solder 14 and the solder balls 35 are not joined. For example, the side surfaces of the pins 13 in the recesses 51 are partially exposed.

In FIG. 10, the side surfaces of the pins 13 in the recesses 51 are partially exposed. The structure example illustrated in FIG. 10 is not restrictive, and the side surfaces of the pins 13 in the recesses 51 may be covered by resin. The resin covering the side surfaces of the pins 13 may be, for example, epoxy resin. By covering the side surfaces of the pins 13 in the recesses 51 with resin, the durability of the pins 13 may be improved.

Figure 11:
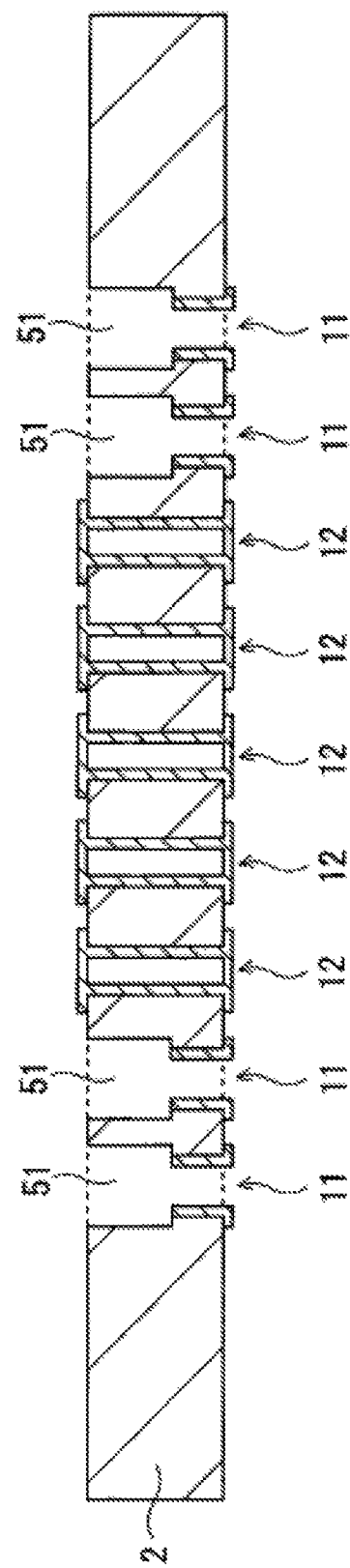
FIG. 11 illustrates an example of a manufacturing process of an electronic device.
Figure 12:
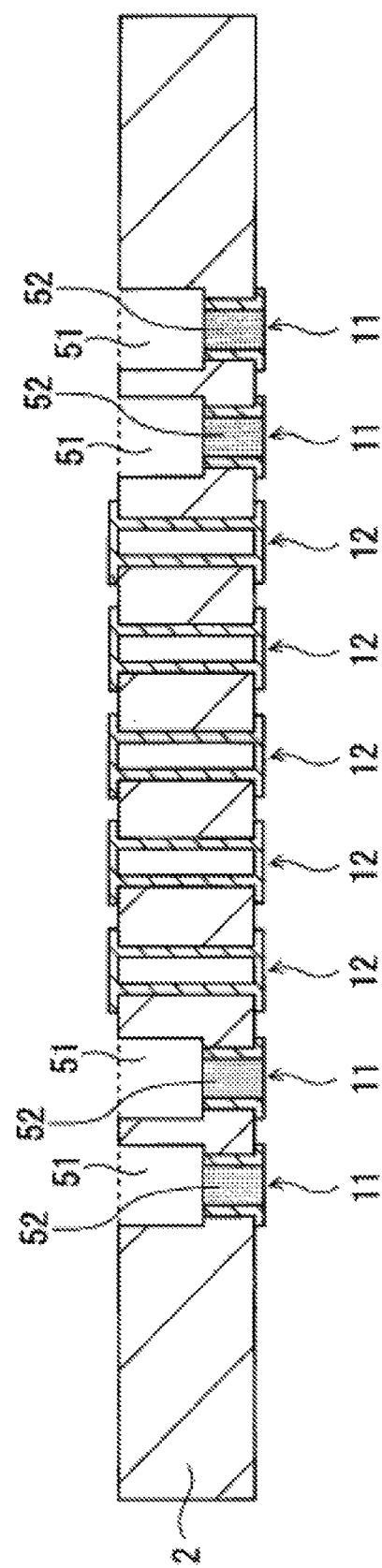
FIG. 12 illustrates an example of a manufacturing process of an electronic device.

FIG. 11 and FIG. 12 illustrate an example of a manufacturing process of an electronic device. The electronic device to be manufactured may be the electronic device illustrated in FIG. 10. A mother board 2 is prepared. A plurality of plated through-holes 11 and 12 penetrating through the mother board 2 are formed in the mother board 2. As illustrated in FIG. 11, a plurality of recesses 51 are formed in the first surface of the mother board 2 using a drill. In this case, the recesses 51 are formed in the first surface of the mother board 2, and at areas coinciding with the plated through-holes 11 and areas around the plated through-holes 11. Therefore, the plated through-holes 11 on the first surface side of the mother board 2 are partially removed, and the plated through-holes 11 remain on the second surface side of the mother board 2. The second surface of the mother board 2 is a surface on the opposite side of the first surface of the mother board 2.

Figure 13:
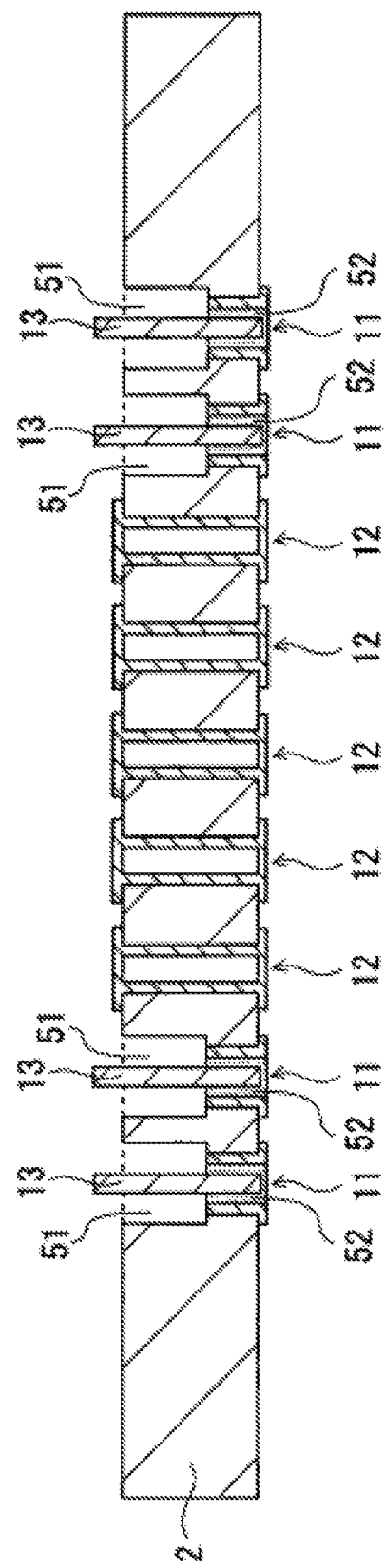
FIG. 13 illustrates an example of a manufacturing process of an electronic device.

As illustrated in FIG. 12, solder paste 52 is filled into respective ones of the plurality of plated through-holes 11. In this case, the solder paste 52 may not be filled into the recess 51. The solder paste 52 contains solder powder and flux. As illustrated in FIG. 13, pins 13 are inserted into respective ones of the plurality of plated through-holes 11, and first ends and middle parts of the pins 13 are protruded from the plated through-holes 11. Therefore, the first ends and middle parts of the pins 13 are not in contact with the solder paste 52.

Figure 14:
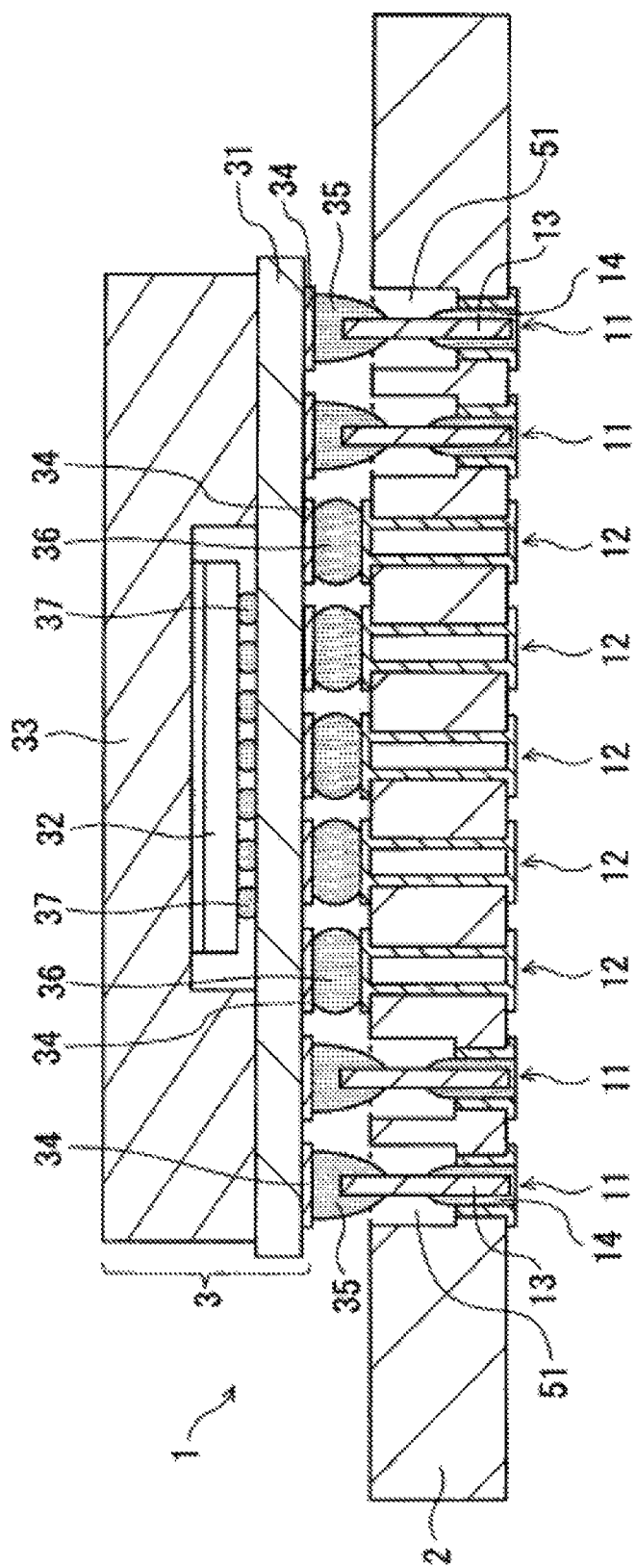
FIG. 14 illustrates an example of a manufacturing process of an electronic device.

A semiconductor package 3 is mounted on the mother board 2. The processing of mounting the semiconductor package 3 on the mother board 2 may be the same as the manufacturing process illustrated in FIG. 4 to FIG. 6. As illustrated in FIG. 14, reflow processing is performed, the pins 13 and the solder balls 35 are joined, and the land patterns 25 and the solder balls 36 are joined. For example, the mother board 2 and the semiconductor package 3 are introduced into a reflow furnace and heating is performed. By performing reflow processing, the solder powder of the solder paste 52 melts, the flux of the solder paste 52 vaporizes, and solder 14 is formed in the plated through-holes 11. Therefore, the inserted parts of the pins 13 are soldered to the plated through-holes 11 by the solder 14 formed in the plated through-holes 11.

By reflow processing, the pins 13 and the solder 14 are joined, and the pins 13 and the solder balls 35 are joined. While reflow processing is performed, the solder 14 and the solder balls 35 are in a melted state. Therefore, while reflow processing is performed, the pins 13 can move vertically in the plated through-holes 11. For example, while reflow processing is performed, the pins 13 can move in the thickness direction of the mother board 2.

While reflow processing is performed, the solder balls 35 melt, and the solder balls 35 deform along the pins 13. Because the recesses 51 are formed just below the solder balls 35, the solder balls 35 enter the recesses 51. The solder 14 and the solder balls 35 are separated by a distance corresponding to the length of the middle part of the pins 13.

Therefore, even when the solder balls 35 deform along the pins 13 owing to reflow processing, the solder 14 and the solder balls 35 are not joined. The plated through-holes 11 and the solder balls 35 are separated by a distance corresponding to the length of the middle part of the pins 13. Therefore, even when the solder balls 35 deform along the pins 13 owing to reflow processing, the plated through-holes 11 and the solder balls 35 are not joined. Therefore, the stress generated in the solder balls 35 may be reduced. As a result, the reliability of the joints between the mother board 2 and the package substrate 31 is improved, and the mounting yield of the semiconductor package 3 may be improved.

Figure 15:
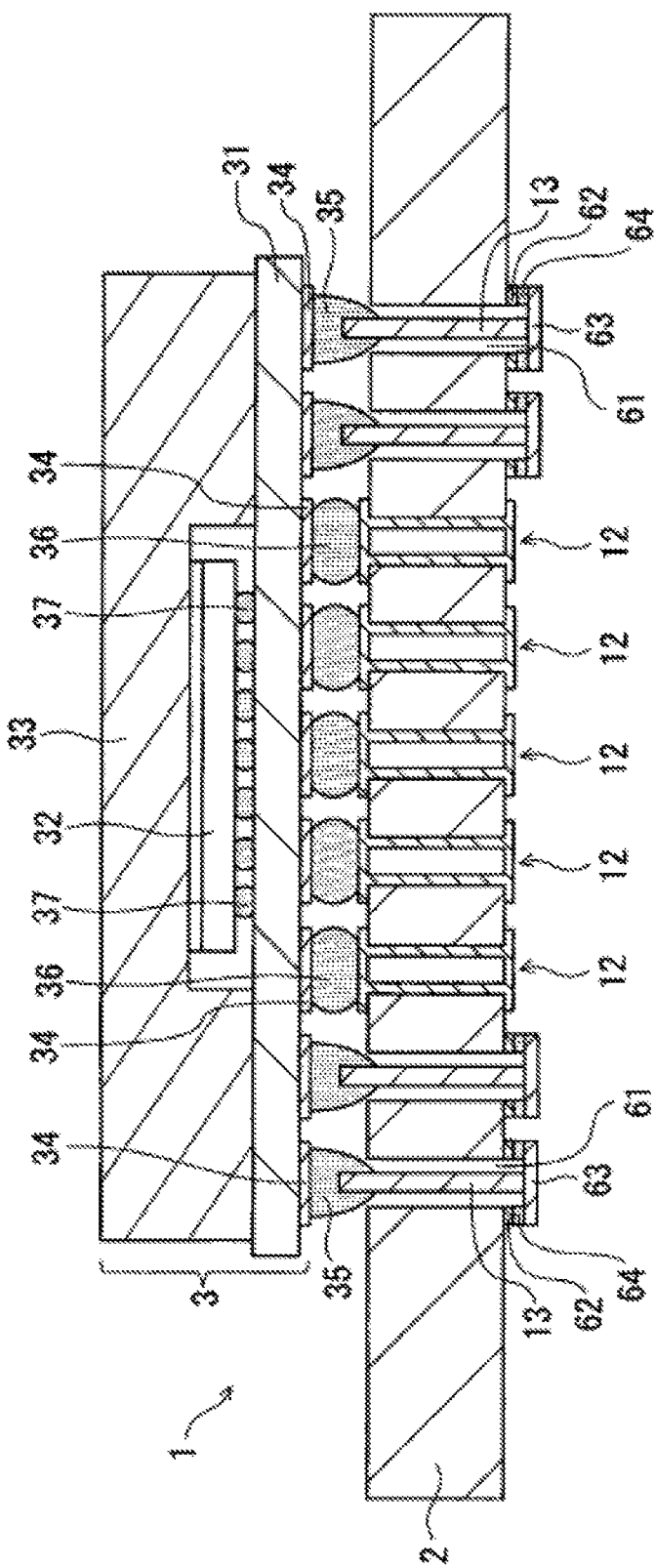
FIG. 15 illustrates an example of a sectional view of an electronic device.

FIG. 15 illustrates an example of a sectional view of an electronic device. In FIG. 15, the same reference signs are used to designate substantially the same or similar components as those illustrated in FIG. 2 or FIG. 10, and the description thereof may be omitted or reduced. The mother board 2 has a plurality of holes 61 penetrating through the mother board 2. The holes 61 are formed in the mother board 2, for example, using a drill. Electrode pads 62 are formed on the second surface of the mother board 2 and around the openings of the holes 61. The holes 61 may be an example of a through-hole.

Pins 13 are inserted in the holes 61. The pins 13 are protruding from the first surface of the mother board 2. First ends of the pins 13 protrude from the holes 61 leading to the first surface of the mother board 2, and are joined to the solder balls 35. Therefore, the pins 13 are soldered to the electrode pads 34 by the solder balls 35. The middle parts of the pins 13 are inserted in the holes 61. Second ends of the pins 13 protrude from the holes 61 leading to the second surface of the mother board 2, and are joined to bases (support plates) 63. The material for the bases 63 may be the same as the material for the pins 13. The pins 13 and the bases 63 may be formed integrally. The pins 13 may be welded to the bases 63. The diameter of the bases 63 is greater than the diameter of the holes 61.

The electrode pads 62 are joined to solder 64 formed between the electrode pads 62 and the bases 63. The bases 63 are joined to the solder 64 formed between the electrode pads 62 and the bases 63. Therefore, the electrode pads 62 and the bases 63 are soldered by the solder 64. For example, the bases 63 are soldered to the second surface of the mother board 2. When, in reflow processing, the solder balls 35 come into contact with the solder paste in the holes 61, and excessive wet-spreading of the solder balls 35 occurs, the strength of the solder balls 35 may decrease. Because the holes 61 are not filled with solder paste, excessive wet-spreading of the solder balls 35 may be suppressed in reflow processing. Therefore, the decease in strength of the solder balls 35 is reduced, and the occurrence of cracks in the solder balls 35 may be reduced. Therefore, the reliability of the joints between the mother board 2 and the package substrate 31 is improved, and the mounting yield of the semiconductor package 3 may be improved. In FIG. 2, FIG. 9, and FIG. 10, bases 63 may be joined to the second ends of the pins 13.

Figure 16:
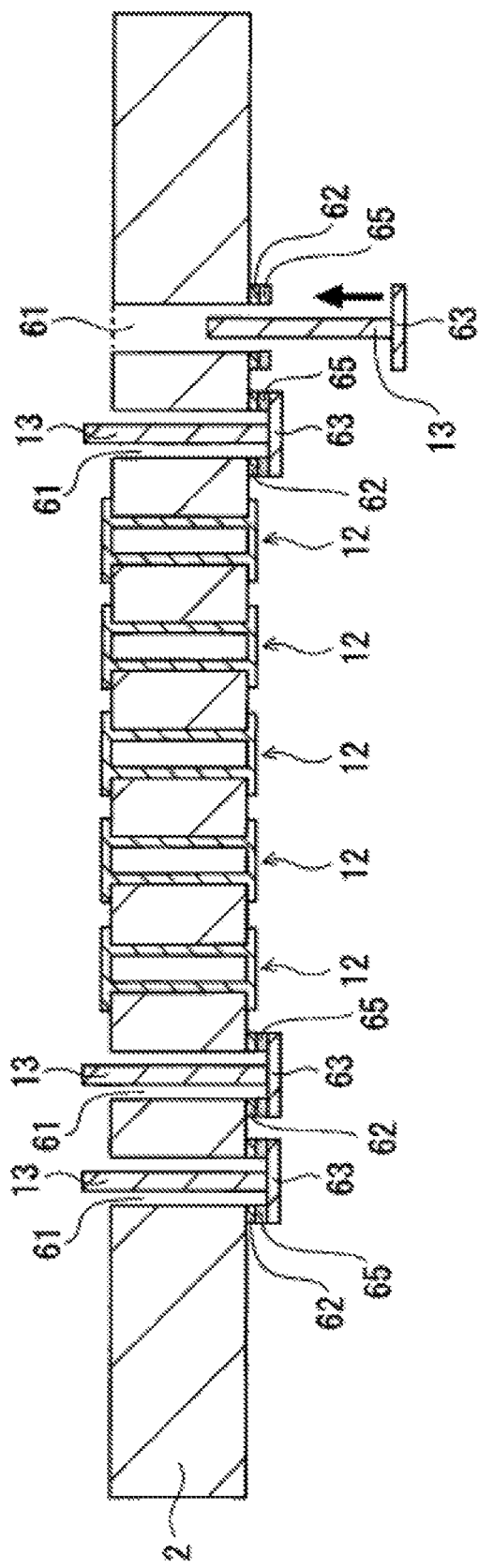
FIG. 16 illustrates an example of a manufacturing process of an electronic device.
Figure 17:
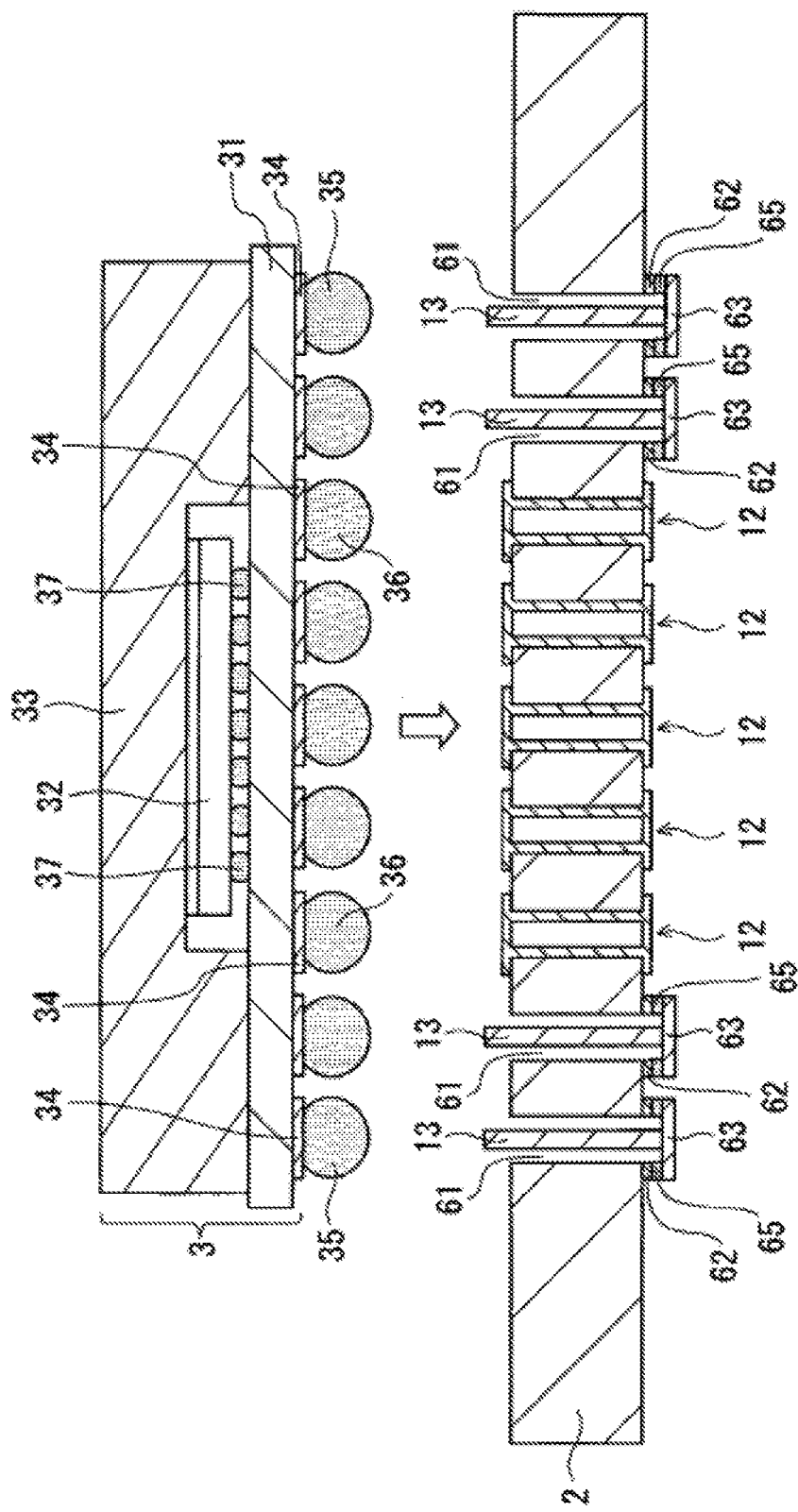
FIG. 17 illustrates an example of a manufacturing process of an electronic device.

FIG. 16 and FIG. 17 illustrate an example of a manufacturing process of an electronic device. The electronic device illustrated in FIG. 15 may be manufactured. As illustrated in FIG. 16, a mother board 2 is prepared. A plurality of holes 61 penetrating through the mother board 2 are formed in the mother board 2. Electrode pads 62 are formed on the second surface of the mother board 2 and around the openings of the holes 61. Next, solder paste 65 is formed on the electrode pads 62. Next, pins 13 are inserted into the holes 61 from the second surface side of the mother board 2.

As illustrated in FIG. 17, a semiconductor package 3 is mounted on the mother board 2. The semiconductor package 3 is mounted on the first surface of the mother board 2. The mother board 2 and the package substrate 31 are thereby disposed so as to be opposed to each other. A plurality of electrode pads 34, a plurality of solder balls 35, and a plurality of solder balls 36 are formed on the second surface of the package substrate 31. Flux is applied to the plurality of solder balls 35 and 36.

By performing reflow processing, the pins 13 and the solder balls 35 are joined, and the land patterns 25 and the solder balls 36 are joined. For example, the mother board 2 and the semiconductor package 3 are introduced into a reflow furnace, and heating is performed. By performing reflow processing, the solder powder of the solder paste 65 melts, the flux of the solder paste 65 vaporizes, and solder 64 is formed between the electrode pads 62 and the bases 63. Thereby, the bases 63 are soldered to the electrode pads 62 by the solder 64. For example, the bases 63 are soldered to the second surface of the mother board 2.

Figure 18:
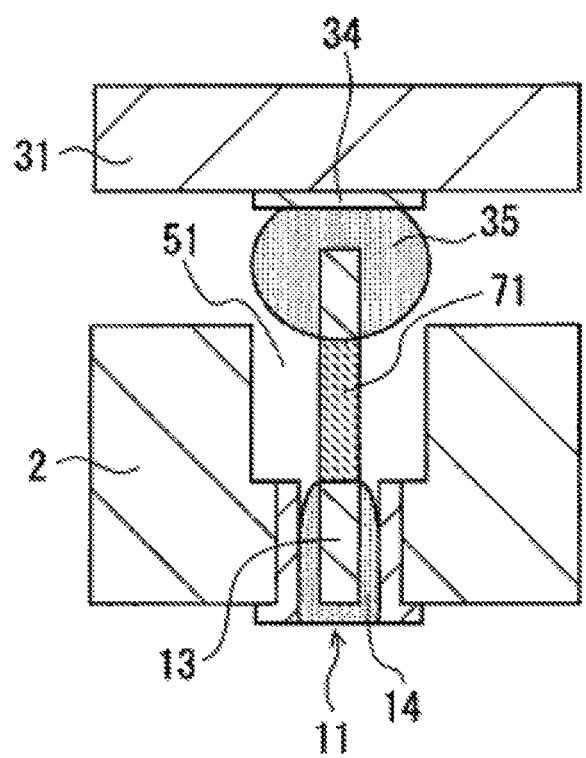
FIG. 18 illustrates an example of a partial sectional view of an electronic device.

FIG. 18 illustrates an example of a partial sectional view of an electronic device. In FIG. 18, the same reference signs are used to designate substantially the same or similar components as those illustrated in FIG. 2, FIG. 10, or FIG. 14, and the description thereof may be omitted or reduced. The mother board 2 has recesses 51 in the first surface of the mother board 2. First ends and middle parts of the pins 13 protrude from the bottom surfaces of the recesses 51, and the first ends of the pins 13 protrude from the openings of the recesses 51. Second ends of the pins 13 are inserted in the plated through-holes 11. Metal platings 71 are applied to the middle parts of the pins 13. The metal platings 71 have low wettability with respect to solder. Examples of the metal platings 71 may include Ni (nickel) plating, Ti (titanium) plating, W (tungsten) plating, Ta (tantalum) plating, and Cr (chromium) plating. Before the pins 13 are inserted into the plated through-holes 11, metal platings 71 may be formed on the middle parts of the pins 13, for example, by sputtering. In FIG. 8 and FIG. 14, metal platings 71 may be applied to the middle parts of the pins 13.

While the reflow processing is performed, the solder balls 35 melts, and the solder balls 35 deform along the pins 13. Metal platings 71 are formed on the middle parts of the pins 13. Since the metal platings 71 have low wettability with respect to solder, excessive wet-spreading of the solder balls 35 is suppressed in the reflow processing. As a result, the decease in strength of the solder balls 35 is suppressed, and the occurrence of cracks in the solder balls 35 is suppressed. The reliability of the joints between the mother board 2 and the package substrate 31 is improved, and the mounting yield of the semiconductor package 3 is improved.

In FIG. 2, FIG. 10, or FIG. 14, pins 13 and solder balls 35 may be used at all of the joints between the mother board 2 and the package substrate 31. In FIG. 2, FIG. 10, or FIG. 14, the warpage of the mother board 2, the warpage of the semiconductor package 3, the warpage of the package substrate 31, and the stress generated in the solder balls 35 may be predicted in advance by simulation. Based on the result of prediction, the part where the pins 13 and the solder balls 35 are joined may be determined. For example, the joining of the pins 13 and the solder balls 35 may be performed in a part where the warpage of the mother board 2 is significant.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor package comprising: a first substrate over which a semiconductor chip is mounted; a second substrate disposed so as to face the first substrate and including a first through-hole through which a pin penetrates and a second through-hole which the pin does not penetrate; wherein the second substrate is formed from a one piece construction; a first solder ball which is formed between the first substrate and the first through-hole and covers an upper end of the pin that protrudes from an upper surface of the second substrate; wherein a most bottom end of the pin does not extend beyond a bottom surface of the second substrate when the pin is fitted within the first through-hole; and a second solder ball which is formed between the first substrate and the second through-hole, the second through-hole is provided under a center part of the first substrate in which the semiconductor chip is mounted and the first through-hole is provided under a peripheral part of the first substrate in which the semiconductor chip is not mounted, solder is provided at a first part which is between a conductive film disposed on an inner sidewall of the first through-hole and the pin and a space is formed at a second part which is between the conductive film and the pin and is adjacent to the upper surface of the second substrate.

2. The semiconductor package according to claim 1, wherein a first portion of the upper surface of the second substrate which is not in contact with the solder ball and a second portion of the upper surface of the second substrate around the upper end of the pin are continuous and flat.

3. The semiconductor package according to claim 1, wherein the first substrate includes the peripheral part on which the semiconductor chip is not mounted and to which the pin is opposed.

4. The semiconductor package according to claim 1, wherein the first substrate includes the center part on which the semiconductor chip is mounted and to which the second through-hole is opposed.

5. The semiconductor package according to claim 4, wherein a recess that leads to the first through-hole and has a diameter greater than a diameter of the first through-hole is formed in a surface of the second substrate that is opposed to the first substrate.

6. The semiconductor package according to claim 1, wherein solder is disposed on a bottom surface side of a portion between a conductive film disposed on the inner sidewall of the first through-hole and the pin and the space is provided on an upper surface side of the portion.

7. The semiconductor package according to claim 1, wherein a plating that has low wettability with respect to solder is applied to a middle part of the pin.

8. An electronic device comprising: a first substrate over which a semiconductor chip is mounted; a second substrate disposed so as to be opposed to the first substrate and including a first through-hole through which a pin penetrates and a second through-hole which the pin does not penetrate; wherein the second substrate is formed from a one piece construction; a first solder ball which is formed between the first substrate and the first through-hole and covers an upper end of the pin that protrudes from an upper surface of the second substrate; wherein a most bottom end of the pin does not extend beyond a bottom surface of the second substrate when the pin is fitted within the first though-hole and a second solder ball which is formed between the first substrate and the second through-hole, the second through-hole is provided under a center part of the first substrate in which the semiconductor chip is mounted and the first through-hole is provided under a peripheral part of the first substrate in which the semiconductor chip is not mounted, solder is disposed on a bottom surface side of a portion between a conductive film disposed on the inner sidewall of the first through-hole and the pin and a space is provided on an upper surface side of the portion.

9. The electronic device according to claim 8, wherein a first portion of the upper surface of the second substrate which is not in contact with the solder ball and a second portion of the upper surface of the second substrate around the upper end of the pin are continuous and flat.

10. The electronic device according to claim 8, wherein the first substrate includes the peripheral part on which the semiconductor chip is not mounted and to which the pin is opposed.

11. The electronic device according to claim 8, wherein the first substrate includes the center part on which the semiconductor chip is mounted and to which the second through-hole is opposed.

12. The electronic device according to claim 8, wherein solder is provided at a first part which is between a conductive film disposed on an inner sidewall of the first through-hole and the pin and the space is formed at a second part which is between the conductive film and the pin and is adjacent to the upper surface of the second substrate.

13. The electronic device according to claim 11, wherein a recess that leads to the first through-hole and has a diameter greater than a diameter of the first through-hole is formed in a surface of the second substrate that is opposed to the first substrate.

14. The electronic device according to claim 8, wherein a plating that has low wettability with respect to solder is applied to a middle part of the pin.

15. A solder mounting method comprising: preparing a first substrate over which a semiconductor chip is to be mounted and a second substrate to be provided so as to face the first substrate; forming a first through-hole in the second substrate so as to face a peripheral part of the first substrate in which the semiconductor is not to be mounted and a second through-hole in the second substrate so as to face a center part of the first substrate in which the semiconductor is to be mounted; wherein the second substrate is formed from a one piece construction; forming a conductive film on inner sidewalls of the first through-hole and the second through-hole; forming patterns which cover respective openings of the second through-hole; filling the first through-hole with solder; inserting a pin into the solder in the first through-hole that penetrates through an upper surface of the second substrate in such a manner that the pin in the first through-hole is surrounded by the solder and wherein a most bottom end of the pin does not extend beyond a bottom surface of the second substrate when the pin is fitted within the first though-hole mounting the semiconductor over the first substrate; and heating to join a solder ball formed on the second substrate to the pin, an amount of the solder to be filled in the first through-hole is adjusted in such a manner that a space is formed in the first through-hole, an upper end of the pin is provided in the space and a bottom end of the pin is surrounded by the solder.

16. The solder mounting method according to claim 15, further comprising forming, before the inserting the pin, a recess that communicates with the first through-hole and has a diameter greater than a diameter of the first through-hole in a surface of the second substrate that is opposed to the first substrate.

17. The solder mounting method according to claim 15, wherein a plating that has low wettability with respect to solder is applied to a middle part of the pin.

* * * * *